United States Patent

Sundermann

[11] Patent Number: 5,899,961
[45] Date of Patent: May 4, 1999

[54] ELECTRONIC CIRCUIT OR BOARD TESTER WITH COMPRESSED DATA-SEQUENCES

[75] Inventor: Jens Sundermann, Boeblingen, Germany

[73] Assignee: Hewlett-Packard Company, Palo Alto, Calif.

[21] Appl. No.: 08/811,153

[22] Filed: Mar. 4, 1997

[30] Foreign Application Priority Data

Apr. 30, 1996 [EP] European Pat. Off. ............... 96106810

[51] Int. Cl.[6] .............................................. G01R 31/3183
[52] U.S. Cl. ...................... 702/117; 371/27.5; 371/22.1; 371/21.1
[58] Field of Search ..................... 364/579, 580, 364/481; 371/27, 22.1, 22.2, 21.1; 324/761, 73.1; 702/117

[56] References Cited

U.S. PATENT DOCUMENTS 4,656,632  4/1987  Jackson .
5,499,248  3/1996  Behrens et al. .
5,579,493  11/1996  Kiuchi et al. ........................... 395/375
5,696,772  12/1997  Lesmeister ................................ 371/27

FOREIGN PATENT DOCUMENTS

149048A1   11/1984  European Pat. Off. .
228332A2   12/1986  European Pat. Off. .
4305442A1   2/1993  Germany .

Primary Examiner—John Barlow
Assistant Examiner—Kamini Shah

[57] ABSTRACT

This invention relates to electronic circuit testing and more particularly to an apparatus utilizing data compression techniques. An electronic circuit or board tester according to the invention includes one tester circuit with the combination of a sequencer and a vector-sequencer-memory per pin. A data-sequence, such as a loop to address the memory cells of an electronic memory one after the other in a predetermined chronological order, is applied to a pin of a device under test and is compressed in order to save memory space.

5 Claims, 4 Drawing Sheets

1. WRITE 0 TO ALL CELLS:

| A2 | A1 | A0 | (ADDRESS PINS) |
|----|----|----|----------------|
| 0  | 0  | 0  |                |
| 0  | 0  | 1  |                |
| 0  | 1  | 0  |                |
| 0  | 1  | 1  |                |
| 1  | 0  | 0  |                |
| 1  | 0  | 1  |                |
| 1  | 1  | 0  |                |
| 1  | 1  | 1  |                |

2. READ 0/WRITE 1 TO ALL CELLS:

| 0 | 0 | 0 |
|---|---|---|
| 0 | 0 | 0 |
| 0 | 0 | 1 |
| 0 | 0 | 1 |
| 0 | 1 | 0 |
| 0 | 1 | 0 |
| 0 | 1 | 1 |
| 0 | 1 | 1 |
| 1 | 0 | 0 |
| 1 | 0 | 0 |
| 1 | 0 | 1 |
| 1 | 0 | 1 |
| 1 | 1 | 0 |
| 1 | 1 | 0 |
| 1 | 1 | 1 |
| 1 | 1 | 1 |

3. READ 1/WRITE 0 TO ALL CELLS (REVERSE ORDER)

| 1 | 1 | 1 |
|---|---|---|
| 1 | 1 | 1 |
| 1 | 1 | 0 |
| 1 | 1 | 0 |
| 1 | 0 | 1 |
| 1 | 0 | 1 |
| 1 | 0 | 0 |
| 1 | 0 | 0 |
| 0 | 1 | 1 |
| 0 | 1 | 1 |
| 0 | 1 | 0 |
| 0 | 1 | 0 |
| 0 | 0 | 1 |
| 0 | 0 | 1 |
| 0 | 0 | 0 |
| 0 | 0 | 0 |

4. READ 0 FROM ALL CELLS:

| A2 | A1 | A0 | (ADDRESS PINS) |
|----|----|----|----------------|
| 0  | 0  | 0  |                |
| 0  | 0  | 1  |                |
| 0  | 1  | 0  |                |
| 0  | 1  | 1  |                |
| 1  | 0  | 0  |                |
| 1  | 0  | 1  |                |
| 1  | 1  | 0  |                |
| 1  | 1  | 1  |                |

ELECTRONIC CIRCUIT OR BOARD TESTER WITH COMPRESSED DATA-SEQUENCES

BACKGROUND OF THE INVENTION

The invention relates in general to electronic circuit testing and more particularly to an apparatus utilizing data compression techniques.

Electronic circuits have become more and more complex and appropriate circuit testers need more and more functionality in order to be able to perform a sufficient test.

As the electronic circuits to be tested comprise a huge amount of electrical connections, such as pins, the equipment needed for the functional test of an electronic circuit increases significantly. Furthermore, there is a need to modify the test patterns to be applied to the electrical connections of an electronic circuit under test or to a board with several integrated circuits to be tested.

An electronic circuit or board tester should be easily adaptable for the test of various electronic circuits or boards having different numbers of electrical connections and functionality. Test parameters should be easily programmable. Each device under test (DUT) comprises several input and output electrical connections, such as pins. An electronic circuit or board tester applies digital signal patterns to the electrical connections of the DUT taking the specifications of the respective DUT into account. Digital output signals or digital patterns generated by the DUT are compared with a signal pattern of the same DUT having full functionality.

A DUT may be a memory circuit or a board with several memory circuits, such as RAMs, SRAMs, VRAMs, pipelined burst SRAMs etc. Each cell or at least most of the memorizing cells of the memory circuit have to be addressed, the binary signals "0" or "1" are written into each tested cell and it is checked, whether the contents of the cells are lost or modified, when accessing other cells of the memory circuit.

In order to carry out such memory tests, industry has developed several standard-test-patterns, such as "march, checkerboard, galpat etc.", addressing the cells in a specific chronical order.

Such standard-test-patterns make use of (for-next) loops and are used for the test of electronic memories and other electronic circuits.

Particularly, electronic circuit or board testers comprising individual tester circuits for each pin of the electronic device under test (DUT) are equipped with a large quantity of electronic memories such as expensive RAMs. Thus there is a need to reduce the amount of memories and/or memory capacity needed for carrying out a functionality test on various electronic circuits or boards, such as those comprising integrated circuits (ICs).

From U.S. Pat. No. 5,402,427 of the applicant, it is known to use a set of vector storage units each storing a segment of a test vector. In case that one test vector comprises two or more identical segments, this segment is stored only once. If for example the test data-segment at pin 1 and pin 2 are the same at the same clock cycle, this segment is stored only once. Furthermore, U.S. Pat. No. 5,402,427 proposes to use several sequences. It will be understood that a combination of a vector storage unit and an associated sequencer, each combination working independently except with regard to the same clock signal, cannot be used. Otherwise identical segments would have to be stored in more than one vector storage unit each being associated with a different electrical connection or pin of the DUT.

When using a modular circuit or board tester with a vector storage unit and an associated sequencer per electrical connection or pin of the DUT, there is a need for an electronic circuit or board tester having another concept.

SUMMARY OF THE INVENTION

The invention provides an electronic circuit or board tester for testing an electronic device (DUT) comprising a plurality of tester circuits, each comprising:

a conductor for providing an electrical connection to said electronic device to be tested;

a first memory storing at least a compressed data-sequence;

a sequencer, such as a CPU or microcontroller, is connected to said first memory via an address bus and a data bus controlling the decompression of said compressed data-sequence and the transfer of said decompressed data-sequence to said electronic device (DUT) or to a first comparator comparing response data of said electronic device (DUT) with said decompressed data-sequence;

each tester circuit is connected with another electrical connection, such as a pin, of said electronic device (DUT) to be tested; and a first clock means for applying a timing signal to said sequencer.

The electronic circuit or board tester according to the invention has a modular concept, comprising a plurality of tester circuits. Each tester circuit is associated with only one electrical connection, such as a pin of an electronic device to be tested and comprises a combination of a memory, such as a RAM, and a sequencer. Each tester circuit and thus each combination of a memory and a sequencer works independently of the other of the combinations, except for the timing signal. The sequencer of each tester circuit is connected with the first memory via an address bus and a data bus.

The invention proposes to use a separate sequencer per pin and to compress each or at least most of the data-sequences per pin. A data processor checks whether each data sequence of the respective pin comprises a data string being repeatedly existing in the data-sequence to be applied to a certain pin or to be transferred to a comparator comparing a response signal of the device under test with the data-sequence. The data processor generates instructions for each sequencer per pin and a compressed sequence per pin. The sequencer instructions and the compressed data-sequence of each pin are stored in one or more memories, such as RAMs, of the tester circuit associated with the respective pin or electrical connection of the electronic device to be tested. A clock means applies a timing signal to each of all tester circuits. During a test each sequencer is operated by its respective sequencer instructions generated from the data processor and stored in a memory of the same tester circuit. Each sequencer decompresses the associated data-sequence of its associated pin or electrical connection of the device under test and generates a decompressed data-sequence being transferred to the associated pin of the DUT or to a comparator of the tester circuit being in connection with the respective pin of the DUT and comparing the decompressed data-sequence with the response signal at the respective pin of the DUT:

According to a first embodiment of the invention, the electronic device to be tested is an electronic memory, such as a RAM, SRAM, VRAM, pipelined burst SRAM a CPU, an ASIC, a microcontroller comprising an electronic memory etc. When performing a test of an electronic memory, each cell or most of the cells of the electronic memory are addressed one after the other (or in more complex order; for example a galpat-test-pattern) by use of an address generator, binary information "0" or "1" is written into the cell and it is checked whether reading the information of another cell or writing into another cell has any influence on cells already comprising binary information. One has developed several standard-test-patterns such as "march, checkerboard, galpat etc.", in order to address the cells of the electronic memory under test in a predetermined chronological order, taking the chip design into account. In addition, operators of electronic circuit or board testers wish to perform self-developed test-patterns.

According to a second embodiment of the invention, the invention proposes to compress the address sequence, which is applied to one address pin of the electronic memory to be tested. The data sequences of all tester circuits which are connected with the address inputs of the device constitute a sequence to address memory cells of the electronic memory one after the other being triggered by a first clock means.

When addressing one cell after the other in an electronic memory an address generator performs a loop. Such for-next-loops start at a predetermined address, increment with the next loop the address by 1, 2, 3 . . . etc., i.e. by a certain step size, and stop at the uppermost address of the loop. At the first address pin of the device under test, such as $A_0$, a loop creates a repeatedly existing data sequence "01". In case of long loops the pin memory of the tester circuit of address pin $A_0$ has to be loaded with a data sequence of binary data-sequence "010101 . . . ". According to the invention, any loop to address a device under test is analyzed by a data processor, the data-sequence of each pin is determined, redundancies are removed and one or more instructions are generated, which repeat the data-sequence without redundancy, i.e. the data-sequence of each pin is compressed. When the data-sequence (operand) is repeated by one or more instructions, a decompressed data-sequence is generated comprising the same address sequence generated by the analyzed loop. Since redundancy is removed and the one or more repeat instructions need much less memory space to be stored in comparison with a data-sequence "010101 . . . ", the invention allows to work with smaller tester memories in the tester circuits per pin of an electronic circuit or board tester.

According to a third embodiment of the invention one or more loops of a test-pattern, such as a standard-test-pattern, are analyzed by a data processor and the per pin data-sequence is compressed, i.e. repeatedly existing data-sequences are removed and instead an appropriate repeat instruction or where appropriate nested repeat instructions are generated to address after decompression, i.e. when the repeat instructions repeat a data-sequence with low or no redundancy, the cells of said memory are addressed in a predetermined chronical order like the one or more analyzed loops. A compressed data-sequence comprises one or more instructions, such as a repeat instruction and an operand.

Instead of generating a compressed data-sequence for a loop to be carried out, one can use a comparator comparing the loop with a set of loops stored in a data base and when found in the data base, the associated already compressed data-sequence stored in this or another data base is used and each relevant memory of each tester circuit per pin is loaded with the associated compressed data-sequence per pin of the device under test.

In addition, an electronic circuit or board tester according to the invention can comprise a comparator to determine, whether a less compressed data-sequence and the associated instructions together need less memory space to be stored than a fully compressed data-sequence comprising more instructions an operand with no redundancy. By such comparator, the necessary memory space to store a compressed data-sequence can be minimized.

According to a fourth embodiment of the invention, a data processor either outside or inside an electronic circuit or board tester, checks, whether a test-pattern to test the device under test comprises the loop: for(address=0; address<n; address=address+1); $A_x, A_{x-1}, A_{x-2}, \ldots A_2, A_1, A_0$=address.

In this case the electronic memory of the tester circuit for the address pin $A_0$ of the electronic device to be tested is loaded with a repeat instruction and the operand "01". The repeat instruction repeats n(uppermost address) divided by 2 times the operand "01". At each cycle the address is incremented by 1.

How to remove the redundancy in each address-data-sequence per pin and to generate the repeat instructions to repeat a data-sequence with no or low redundancy comprising the same information as the decompressed data-sequence will be explained later by drawings. In addition, it will be explained in more detail how the data processor determines the compressed data-sequence (instructions+operand with no or low redundancy) for each tester circuit per address pin of the memory to be tested.

One will understand that the existence of other loops can be checked by a comparator or the like, for example loops starting at an address, which is different from 0 and/or incrementing the address by more than 1 each cycle. In these cases a data processor makes use of so-called standard upcounting sequence trees, each representing the address data-sequence of one address-pin in graphical form instead of a data-sequence of binary "0"s and "1"s. A standard upcounting sequence tree of the associated address pin shows the operands and the repeat instructions for a loop to address one memory cell after the other, i.e. a loop starting with address=0 and incrementing the address each step in the loop by 1 (standard loop). The data processor compares the address loop which has to be performed by the circuit or board tester during the test of an electronic memory with the standard loop and modifies the standard upcounting sequence tree of each pin accordingly, if the start address is different from "0" or the step size is different from "1".

Thereby the data processor is able to generate the compressed address data-sequence of each address pin in significantly shorter time than it would need to generate the data-sequence of an address pin for the loop to be performed, to analyze it with regard to repeatedly existing parts in the data-sequence, to remove redundancy and to generate the appropriate repeat instructions and the operands with no or low redundancy. Sequence trees, upcounting or downcounting, make use of the fact, that the data-sequence at each pin is very regular for the standard loop and most of the other loops which have to be performed by a circuit or board tester when testing an electronic memory.

It is understood and expressly noted that the invention relates to all useful and novel combinations of the above disclosed features, whether alone or in any other arbitrary combination. Furthermore, all cited advantages can be seen as objects solved by the invention in its entirety.

BRIEF DESCRIPTION OF THE DRAWINGS

FIG. 3 is a table showing the data sequence at each address pin of a very small electronic memory with light memory cells for a march-pattern;

FIG. 1 shows a tester circuit 10 to transfer a decompressed data-sequence to an electrical input connector 18 of an electronic device (DUT) to be tested or to a comparator 14 in case that a circuit tester 10 is connected with an electrical output connector of the electronic device (DUT) to be tested.

Figure 1:
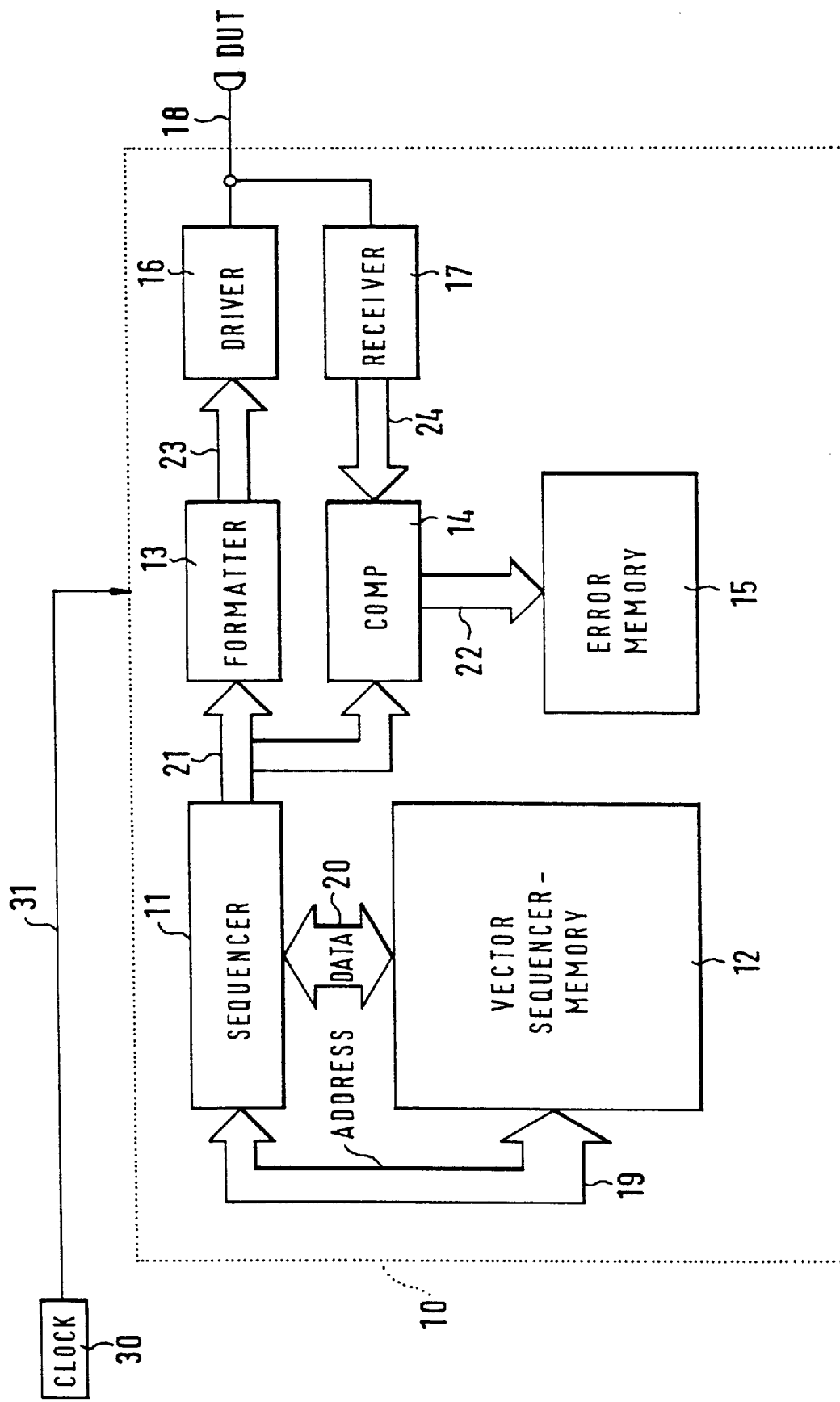
FIG. 1 is a block diagram of a tester circuit of an electronic circuit or board tester for the test of an electrical connection, such as a pin, of an electronic device (DUT) to be tested.

The electronic circuit 10 comprises a sequencer 11, such as a software controlled microprocessor (not shown), a vector-sequencer-memory 12, such as a RAM, a formatter 13, a comparator 14, a driver 16, a receiver 17 and an error memory 15. A clock 30 is electrically connected with each of the electronic circuits of the tester circuit 10 and which need a clock signal for their proper operation (for better understanding, the electrical connections for the clock signals are not shown in detail). The sequencer 11 is connected via an address bus 19 and a data bus 20 with the vector-sequencer-memory 12.

In the memory 12 a data-sequence to be applied to the electrical connection of pin 18 of the device under test (DUT) in decompressed form is stored in a compressed format. Furthermore, in the memory 12 sequencer instructions for sequencer 11 are stored. During the test, clock 30 triggers each electronic circuit, and the sequencer clockwise loads parts of the compressed data-sequence and sequencer instructions into a sequencer storage unit (not shown) from memory 12 via the data bus 20. The sequencer instructions cause a sequencer controller (not shown) to address the relevant cell of the memory 12 and the compressed data-sequence is loaded sequentially in the sequencer storage unit and is decompressed by the sequencer to the data-sequence.

In case that the electrical connection 18 of the device under test is an input pin, the decompressed data-sequence is transferred via bus 21 to a formatter 13 and from the formatter 13 via a bus 23 to a driver 16. The formatter 13 and the driver 16 modify the decompressed data-sequence with regard to the specific operation conditions of the DUT.

In case the electrical connection 18 is an output pin of the device under test, the response-data-sequence of the output pin 18 is transferred to receiver 17 and forwarded to comparator 14 via a bus 24. Instead of forwarding the decompressed data-sequence to the formatter 13, the data-sequence is transferred to the comparator 14 via the bus 21. In case that the response-data-sequence of the output pin 18 of the device under test (DUT) is not the same as the data-sequence generated by the sequencer 11, the comparator 14 writes in an error memory 15 which bits at the same place in those sequences were the same and which bits were not the same.

The use of several tester circuits 10 allows to configurate an electronic circuit or board tester having a modular concept and being easily adaptable for the test of various electronic devices, such as integrated circuits (ICs), boards with electronic devices or ICs. Each of such tester circuits 10 can be used in connection with an output pin or an input pin of the device under test (DUT). It will be understood that also a tester circuit can be used which does not comprise a comparator, a receiver and an error memory if only used in connection with an input pin of the DUT. On the other hand the circuit tester which does not comprise formatter 13 and driver 16 can be used in connection with an output pin of the DUT.

Figure 2:
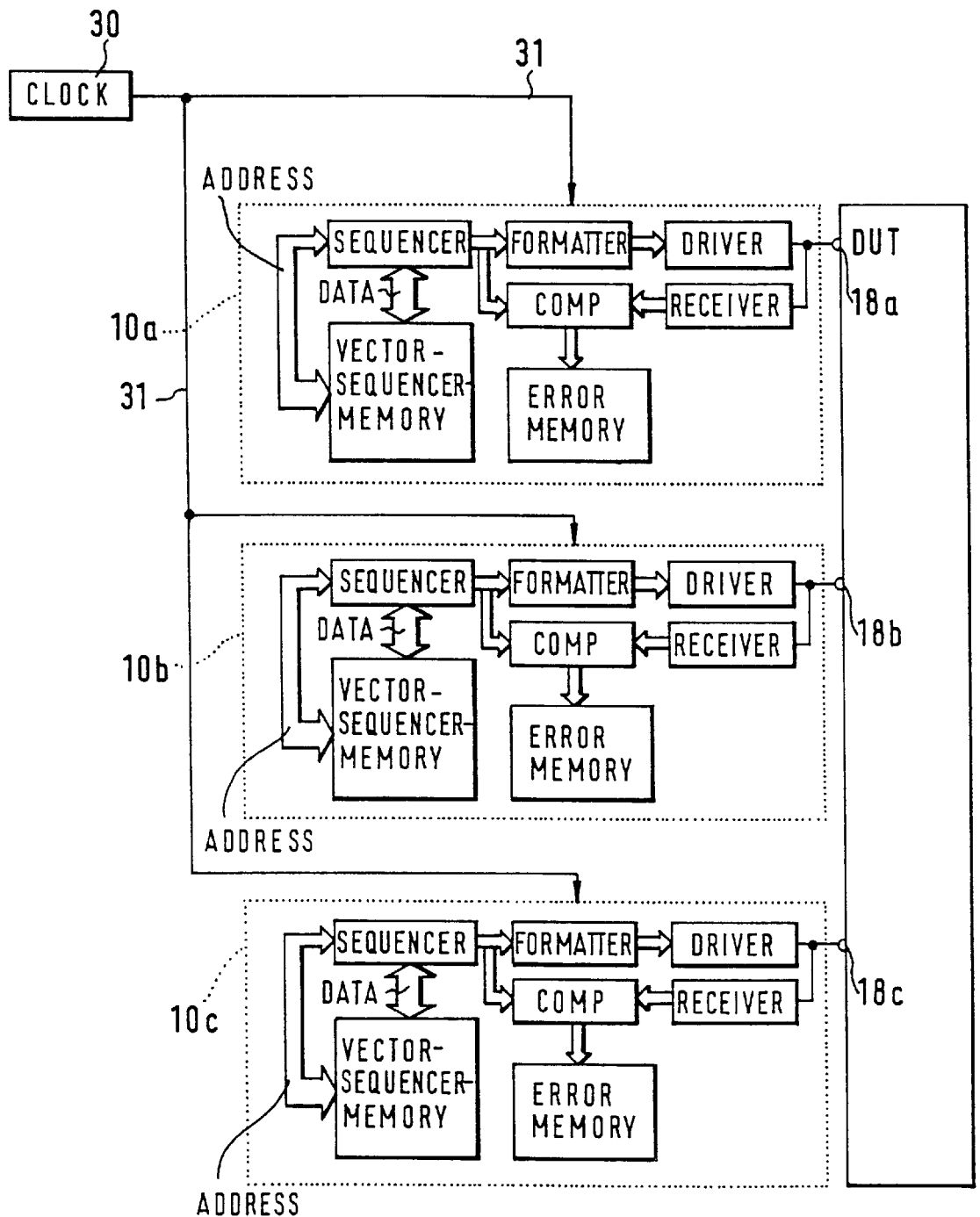
FIG. 2 is a block diagram of a modular electronic circuit or board tester comprising three tester circuits of the same kind each being in electrical connection with a different pin of a DUT.

FIG. 2 shows an electronic circuit or board tester with three tester circuits 10a, 10b and 10c as shown in FIG. 1. Each circuit tester 10a, 10b, 10c is connected with a different electrical connection 18a, 18b and 18c, such as a pin, of the electronic device DUT to be tested. A common clock means 30 is connected with each of the tester circuits 10a, 10b and 10c and its electronic devices via an electrical connection 31, such as a wire.

As every pin or electrical connection 18a, 18b and 18c of the DUT is associated with its own tester circuit, comprising a sequencer 11 and a vector-sequencer-memory 12, a different data-sequence can be forwarded to the associated electrical connection of the DUT or to the associated comparator of each tester circuit 10a, 10b, and 10c.

FIG. 3 is a table showing the data-sequence at each address pin of a very small electronic memory with eight memory cells for a "march-test-pattern". Only for better understanding a very small device has been chosen.

When performing a march-pattern as a first step the binary information "0" is written to all memory cells. In order to be able to do that, all memory cells have to be addressed via the address pins $A_0$, $A_1$ and $A_2$. During a first clock cycle to each address pin, $A_0$, $A_1$ and $A_2$ a binary "0" is applied and thereby the first memory cell is addressed. At the next clock cycle, a binary "1" is applied to the address pin $A_0$ and a binary "0" to each of the address pins $A_1$ and $A_2$ to address the second memory cell of the small electronic memory. The rest of the first step is self-explanatory and to be seen from FIG. 3.

During the second step the first memory cell is addressed by applying "000" to each of the address pins $A_0$, $A_1$ and $A_2$. Binary "0" already written into the first cell during the first step is read out of the first memory cell. During the next clock cycle the first memory cell is again addressed by applying "000" at the address pins $A_0$, $A_1$ and $A_2$. During this cycle a binary "1" is written into the first cell. The same is performed with all remaining memory cells as will be easily seen from the second step in FIG. 3.

In the third step the second step is carried out in reverse order, i.e. read binary "1" written in the second step and then write binary "0" one after the other into each remaining memory cells.

In the fourth step, binary "0" already written into each cell during the third step is read out one after the other from each cell and each cell is addressed one after the other.

As will be seen from FIG. 3 the data-sequences for the different address pins are very regular. Instead of loading the data-sequence for the specific pin into the memory of the tester circuit for each pin, the invention proposes to compress the data-sequences independently per pin and to store one or more instructions and an operand, without any or low redundancy.

Figures 4, 5:
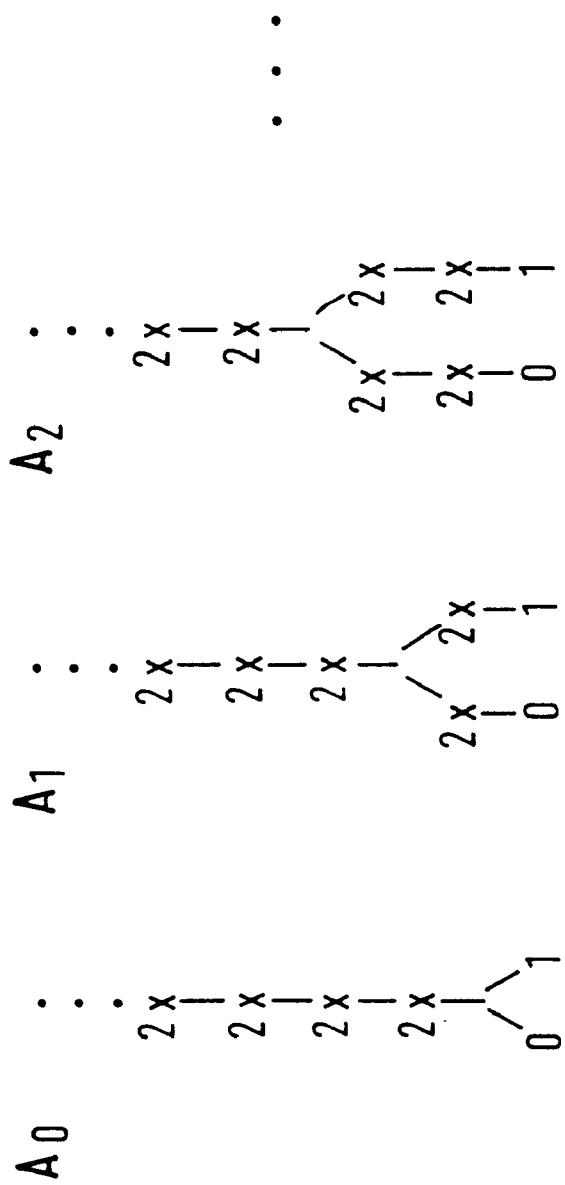
FIG. 4 shows a compressed data-sequence for pin $A_1$ of the example in FIG. 3.
FIG. 5 shows the data-sequence in the form of a so-called "up-counting binary tree" to be applied to the address pins $A_0$ . . . of an electronic memory to address each memory cell one after another.

FIG. 4 shows the compressed data-sequence for pin $A_1$ of the example in FIG. 3. The formula has to be read as follows (from the left to the right, beginning with the expressions in the brackets):

An instruction to repeat two times "0", then an instruction to repeat two times binary "1", the foregoing has to be performed two times, one after another.

Then an instruction to generate four times binary "0", an instruction to generate four times "1" and the instruction to generate two times the foregoing one after another.

Then generate four times binary "1", instruction to generate four times binary "0", and the instruction to repeat the foregoing two times one after another.

Then instruction to generate two binary "0", instruction to generate the operand binary "1" and then the instruction to repeat the foregoing two times one after another.

If this compressed form of the march-pattern is stored in the memory of a tester circuit of address pin $A_1$ one needs much less memory space than one would need to store the data-sequence shown in FIG. 3 under the address pin $A_1$.

It will be understood and is explicitly noted that the teaching of the invention can also be used for electronic memories with more or much more memory cells and which are tested with different patterns. In addition, the teaching of the invention can be applied easily by those skilled in the art to test memory-devices which have to be accessed by using a scrambling-table, i.e. that addresses are mapped into other addresses. Scrambling is often used, when the first cell is not directly arranged beside the second memory cell etc. because of the chip-layout but the operator wishes to access the cells one after another how they are physically arranged during the test. In this case the standard up-counting trees for each address pin are modified according to the modification of the standard loop due to scrambling.

In order to reduce redundancy in the data-sequence of each address pin, the invention proposes to use binary trees that describe the up-counting sequence of each pin. When handling down-counting loops they are converted into up-counting loops with the same parameters and all upcounting sequence trees within the loop are mirrored.

FIG. 5 shows the data-sequences in the form of a so called "up-counting binary tree" to be applied to the address pins $A_0$, $A_1$, $A_2$ . . . of an electronic memory to address each memory cell one after the other (standard loop).

In the up-counting binary tree for $A_0$ one will find the operands "0" and "1" at the lowest level and above the repeat instructions "2x", i.e. to repeat "01" until the end of the specific loop.

In the up-counting binary tree for $A_1$ one find the operands "0" and "1" at the lowest level. In the first step the operand "0" is repeated 2 times, then the operand "1" is repeated 2 times and then the foregoing is repeated again and again until the end of the specific loop.

In the up-counting tree for $A_2$ one will find the operands "0" and "1" at the lowest level. In the first step the operand "1" is repeated 2 times 2 times, then the operand "1" is repeated 2 times 2 times and then the foregoing is repeated until the end of the specific loop to be performed at the specific address pin of the circuit or board tester according to the invention.

As will be seen easily, the standard binary trees for each address pin are very regular, from address pin to address pin each operand is repeated 2 more times prior to repeating the foregoing. Thus it will be easy to continue to determine the standard up-counting sequence trees for the following address pins (not shown).

Since the standard up-counting tree is already a compressed data-sequence with repeat instructions and operands with no redundancy the invention proposes that a data processor compares the loop to be performed by the tester with the standard standard loop and modifies the standard up-counting loop accordingly.

For example, if only every second cell (1, 3, 5, . . . ) shall be addressed beginning with the first cell, in the first tree (tree of $A_0$) the left operand "0" on the first level is removed from the tree. In the second tree (tree of $A_1$) the left and the right instruction "2x" on the second level is removed. In the third tree (tree of $A_3$) the left and the right repeat instruction "2x" on the second level is removed again and so on.

Always remove complete level immediately above the operand's level (leaves of the tree), if "2x" (for example the immediate level above the operand's level in the tree of $A_0$ is

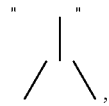

i.e. different from "2x"). Otherwise remove left or right operand (for example in $A_0$) depending on the start value of the loop.

If the step size of the loop is "4" then the data processor will carry out the foregoing removal twice and so on, if step size is larger than "4".

I claim:

1. An electronic tester for testing an electronic memory, said tester including a plurality of tester circuits, and comprising:

a first memory for storing at least a compressed data-sequence which comprises an instruction and an operand, said instruction being a repeat instruction to repeat an operand for a predetermined number of clock cycles;

a sequencer, connected to said first memory via an address bus and a data bus, for controlling decompression of said compressed data-sequence to a decompressed data-sequence, and a transfer of said decompressed data-sequence to said electronic memory or to a first comparator which compares response data of said electronic memory with said decompressed data sequence, said decompressed data sequence being an address sequence which is applied to one address pin of the electronic memory, and data sequences of all tester circuits which are connected with address inputs of the electronic memory comprising sequences for addressing memory cells of said electronic memory, one after another; and wherein said compressed data sequence is reiteratively executed and comprises:

for (address=0; address<n; address=address+1); $A_X$, $A_{X-1}, A_{X-2}, \ldots, A_2, A_1, A_0$=address and the address pin $A_0$ of said electronic memory is:

$n/2 \times \text{``01''}$ with:

address=0: first address n: uppermost address address=address+1: increment address by 1 each cycle $A_X, \ldots, A_0$: address pins n/2×: instruction to repeat "01" n/2 times.

2. An electronic circuit or board tester as recited in claim 1, wherein a totality of all data sequences of said tester circuits constitute one or more loops to address cells of said electronic memory, one after another in a predetermined order.

3. An electronic circuit or board tester as recited in claim 2, wherein said one or more loops constitute at least a part of a standard-test-pattern to address the cells of said memory in a predetermined chronological order.

4. An electronic circuit or board tester as recited in claim 1, wherein said compressed data sequence for the address pin $A_1$ is:

$n/4 \times (2 \times \text{``0''}; 2 \times \text{``1''})$, wherein "0" is repeated 2 times, then "1" is repeated 2 times and then the foregoing is repeated n/4 times.

5. An electronic circuit or board tester for testing an electronic device, said tester including a plurality of tester circuits, and comprising:

a conductor for providing an electrical connection to said electronic device to be tested;

a first memory for storing at least a compressed data-sequence which comprises an instruction and an operand, said operand comprising a sequence of binary "0" and "1" data without any repetition of a part of said sequence of "0" and "1" data;

a sequencer, connected to said first memory via an address bus and a data bus, for controlling decompression of said compressed data-sequence to a decompressed data-sequence, and a transfer of said decompressed data-sequence to said electronic device or to a first comparator which compares response data of said electronic device with said decompressed data sequence;

each tester circuit being connected with another electrical connection to said electronic device to be tested; and a first clock means for applying a timing signal to said sequencer.

\* \* \* \* \*